United States Patent [19]

Chang et al.

[11] 4,232,401
[45] Nov. 4, 1980

[54] MILLIMETER WAVE IMAGE GUIDE INTEGRATED BALANCED MIXER

[75] Inventors: Yu-Wen Chang, Rancho Palos Verdes; Jeffrey A. Paul, Torrance, both of Calif.

[73] Assignee: The United States of America as represented by the Secretary of the Army, Washington, D.C.

[21] Appl. No.: 67,974

[22] Filed: Aug. 20, 1979

[51] Int. Cl.³ .............................................. H04B 1/26
[52] U.S. Cl. .................................... 455/328; 333/239
[58] Field of Search ................................. 455/325–328; 333/239, 248; 363/157, 158, 159

[56] References Cited

U.S. PATENT DOCUMENTS

| | | | |
|---|---|---|---|
| 2,943,192 | 6/1960 | Liss | 455/328 |
| 3,854,083 | 12/1974 | Hulderman et al. | 455/328 |
| 3,903,488 | 9/1975 | Fong | 333/239 |
| 3,986,153 | 10/1976 | Kuno et al. | 333/239 |
| 3,995,238 | 11/1976 | Knox et al. | 455/326 |
| 4,006,425 | 2/1977 | Chang et al. | 333/239 |
| 4,032,849 | 6/1977 | Gyssel et al. | 455/327 |

*Primary Examiner*—Jin F. NG
*Attorney, Agent, or Firm*—Nathan Edelberg; Jeremiah G. Murray; Bernard Franz

[57] ABSTRACT

Disclosed is a millimeter wave integrated circuit balanced mixer including two signal ports, a local oscillator and an input signal port, coupled to a pair of solid state millimeter wave mixer diodes by means of an image guide 3db hybrid signal coupler and a pair of mixer cavities formed from a wafer of boron nitride whose bottom surface is metallized and soldered onto a metal substrate having a metal surface defining an image plane. The signal coupler consists of two curved lengths of boron nitride image guide having a spacing therebetween in the form of a thin slot for providing the proper coupling factor. The cavities formed in the boron nitride wafer are metallized and are configured to receive one like end of the respective image waveguides. The opposite ends of the image waveguides are tapered and are located in image guide to wavelength transitions at the respective signal ports. IF output signal lines in the form of metallized lines are located on the end portion of the image guides in the respective cavities for coupling to an IF amplifier.

11 Claims, 7 Drawing Figures

U.S. Patent  Nov. 4, 1980  4,232,401
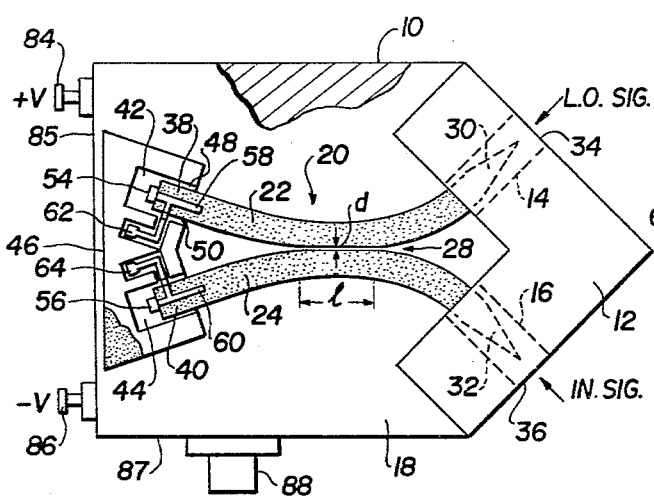
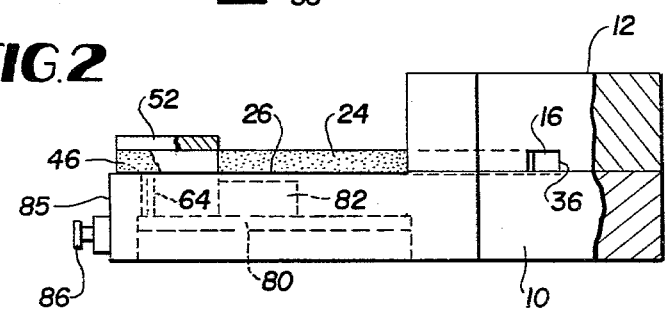
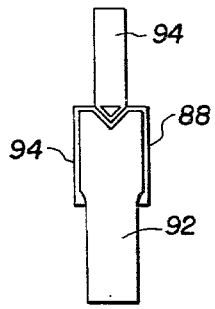
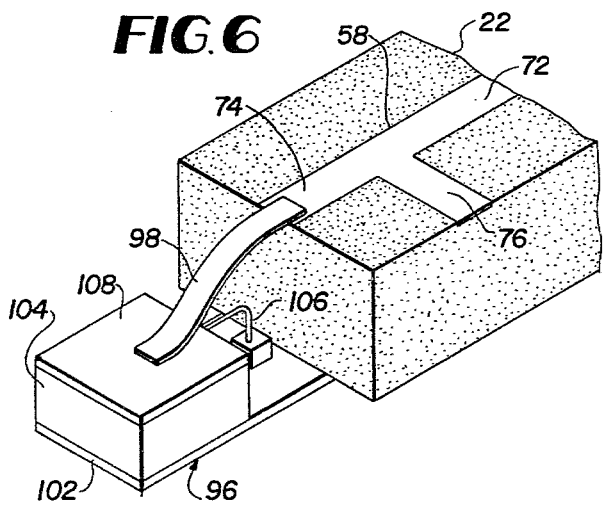
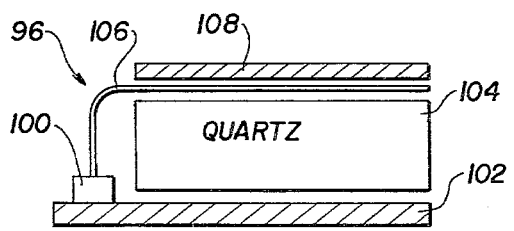

MILLIMETER WAVE IMAGE GUIDE INTEGRATED BALANCED MIXER

The invention described herein may be manufactured and used by or for the Government for governmental purposes without the payment of any royalties thereon or therefor.

CROSS REFERENCE TO RELATED APPLICATION

This application is related to U.S. Ser. No. 67,975 (U.S. Army ERADCOM Docket No. D-1960) entitled, "Millimeter Wave Image Guide Integrated Oscillator", filed on Aug. 20, 1980, in the names of Y. W. Chang, et al., which application is also assigned to the assignee of the present invention.

BACKGROUND OF THE INVENTION

The present invention relates generally to millimeter wave integrated circuit structures and more particularly to a balanced mixer incorporating image waveguide components.

Image waveguide transmission line devices consisting of a dielectric waveguide mounted upon a conductive image plane are well known. Additionally, such apparatus has been fabricated into integrated circut devices including active circuit elements in order to implement various types of circuitry. Typical examples of such apparatus is disclosed in U.S. Pat. No. 3,986,153, entitled "Active Millimeter Wave Integrated Circuit", which issued on Oct. 12, 1976, to H. J. Kuno, et al., U.S. Pat. No. 4,006,425, entitled "Dielectric Image Guide Integrated Mixer/Detector Circuit", which issued on Feb. 1, 1977 to Y. W. Chang, et al., and U.S. Pat. No. 3,995,238, entitled "Image Waveguide Transmission Line and Mode Launchers Utilizing Same", which issued on Nov. 30, 1976 to R. M. Knox, et al. The latter reference discloses several types of waveguide transmission line circuits including a mixer circuit and a signal coupler formed by dielectric image waveguide components attached to an image plane by a thin film of plastic.

While such apparatus has proven to be satisfactory for certain millimeter wave applications, prior art practice is inherently deficient in providing a ruggedized structure which exhibits greater efficiency, reliability and performance coupled together with an enhanced fabrication simplicity as well as minimum size, cost and weight.

SUMMARY

Accordingly, it is an object of the present invention to provide a new and improved millimeter image waveguide integrated circuit.

Another object is to provide an integrated circuit of the type described which is relatively economical in its fabrication as well as being durable and reliable in its operation.

Yet another object of the present invention is to provide a millimeter wave integrated circuit of the balanced mixer type.

Briefly, the subject invention is directed to a balanced mixer incorporating a pair of millimeter wave semiconductor diodes respectively located in adjacent cavities formed in a metallized dielectric wafer consisting of boron nitride soldered on a conductive image plane. Each cavity, moreover, is coupled to a signal coupler consisting of two curved lengths of boron nitride image guide preferably formed from the same wafer from which the cavities are formed. The two lengths of image waveguide are separated by means of a small slot of predetermined length and width for providing the proper coupling factor. The ends of the two image waveguides from the coupler are tapered and are located in respective image waveguide to metal waveguide transitions which define a local oscillator signal port and an input signal port. The image waveguide to metal waveguide transitions are formed from the image plane surface and a metal block having appropriately formed channels of rectangular cross section. The IF output from the cavities are coupled by means of metallized conductor lines formed on the top surface of the image guides to IF amplifier means located on a circuit board located on the under side of the image plane substrate.

These and other objects of the subject invention will become more fully apparent when the following description is considered in light of the accompanying drawings.

DESCRIPTION OF THE DRAWINGS

FIG. 1 is a top plan view, portions of which are cut away, of the preferred embodiment of the subject invention with the metallic cover for the cavities removed;

FIG. 2 is a side planar view generally illustrative of the embodiment shown in FIG. 1 and including the cover for the mixer cavities;

FIG. 3 is an enlarged fragmentary view of the upper left hand portion of FIG. 1;

FIG. 4 is a fragmentary perspective view of a portion of one image guide member the end of which is located in a cavity shown in FIG. 1 and which provides the mounting surface for the beam lead mixer diode;

FIG. 5 is a plan view of a typical beam lead diode package;

FIG. 6 is a fragmentary perspective view of a boron nitride image guide member located in a cavity shown in FIG. 1 and being coupled to a silicon Schottky mixer diode package; and FIG. 7 is an exploded side plan view of the Schottky diode package shown in FIG. 5.

DESCRIPTION OF THE PREFERRED EMBODIMENT

Referring now to the drawings and more particularly to FIGS. 1 and 2, reference numeral 10 designates a metal substrate consisting of, for example, gold plated aluminum on which is located a metal block 12 containing two linear channels 14 and 16 of rectangular cross section. The block 12 as shown in FIG. 1 comprises an angulated member and also consists preferably of gold plated aluminum. The surface 18 of the gold plated aluminum substrate 10 defines a conductive image plane for an image guide 3-db hybrid coupler 20 comprising two curved lengths 22 and 24 of boron nitride (BN) having an under surface 26 metallized with successively applied films of 500 Å Cr, 3000 Å Pt, and 10,000 Å Au. The metallization is then bonded by means of soldering with a Pb-Sn composition to the image plane surface 18.

The two image guide elements 22 and 24 are preferably formed from a common slab or wafer of boron nitride and during fabrication a coupling slot 28 is formed between the two image guide elements 22 and 24. The slot 28 has a predetermined length L and separation d typically being 0.271 in. and 0.005 in. to 0.010 in. respectively in order to provide a proper coupling factor for operation, for example, in the region of 60 GHz. Additionally, the image guide elements 22 and 24 have typical height and width dimensions of 0.050 in. and 0.100 in. The overall length of the substrate 10, for example, is 2.41 in. while having a width of 1.50 in.

The mutually opposing ends of the image guide elements 22 and 24 are diverge as indicated in FIG. 1. The end portions 30 and 32 of the image waveguide elements 22 and 24, moreover, are tapered and are located in the channels 14 and 16 to provide an image guide to metal waveguide transition for the signal ports 34 and 36 which are adapted to be respectively coupled to a local oscillator signal frequency source and an input signal frequency source, not shown. The opposite end portions 38 and 40 of the two image guide elements 22 and 24 are located respectively in a cavity structure including a pair of identical air filled cavities 42 and 44 configured from a boron nitride member 46 which is preferably formed from the same boron nitride wafer as the image waveguide elements 22 and 24. The shape of the boron nitride element 46 is irregular due mainly to the diverging nature of the curved lengths of image waveguide 22 and 24. The cavities 42 and 44, however, are generally rectangular in shape and the outer surfaces both in and outside of the cavities are metallized with a gold composition so as to form a metallized resonant cavity. The cavities are adapted to provide an approximately $\frac{1}{4}$ wavelength termination behind respective mixer diodes mounted therein. Both cavities, moreover, are formed such that decoupling slots 48 and 50 as shown in FIG. 3 exist on either side of the image waveguide elements for the purpose of decoupling the image guide from the respective cavity within which it projects. In operation, a metal cover 52 (FIG. 2) is placed over the metal cavities 42 and 44 to prevent millimeter wave leakage from the cavities as well as acting as part of the load impedance seen by a pair of semiconductor millimeter wave mixer diodes 54 and 56 respectively located in the cavities. The end portions 38 and 40 of the image waveguide elements 22 and 24 additionally include metallized lines 58 and 60 one of which is shown in detail in FIG. 3. These lines are adapted to provide millimeter wave matching and couple IF signals from the cavities 42 and 44 to a pair of conductive feedthroughs 62 and 64.

Reference is made now to FIG. 3 which is intended to show the details of one of the two identical metallization line patterns of the lines 58 and 60. A right angled channel 66, for example, is formed in the surface of the boron nitride member 46 wherein a metallized square patch 68 is formed which couples to a relatively thinner angulated metallized line portion 70 which feeds to the edge of the slot 50 in the cavity 42. The metallized line pattern 58 formed on the image waveguide element 22 consists of a tuning stub portion 72 and a forward portion 74 which connects to the diode 54. The IF output is fed from a side leg portion 76 which by means of a jumper 78, which may be for example a gold ribbon element, couples to the line 70.

The feedthroughs 62 and 64, to which the IF output signals are connected, pass through to the bottom portion of the substrate 10 and comprise, for example, coaxial line components which couple to a circuit board 80 containing an IF amplifier 82 located on the underside of the metal substrate. This location is mainly a matter of choice. The IF amplifier 82 constitutes a well known device a typical example being an Avanteck model No. UTO 1011. Such an amplifier is adapted to operate over the range of 2 MHz through 1000 MHz. Power for the IF amplifier as well as the diodes 54 and 56 are provided by a supply potential, not shown, which is adapted to be coupled to terminals 84 and 86, respectively, mounted on the rear face 85 of the substrate 10. The output of the amplifier 82 is adapted to be provided at the side 87 of the substrate 10 where a coaxial output connector 88 is provided.

FIGS. 4 through 7 are intended to show two variations of solid state mixer diode packages which are adapted to be utilized in the resonant cavities 42 and 44 shown in FIG. 1. Referring first to FIG. 4, the configuration shown therein is substantially the same as shown in FIG. 1 and illustrates a beam lead diode package 88 which is attached to the rectangular end face 90 of the image guide element 22, for example. The beam lead diode package includes a relatively wide cathode lead 92 and a substantially thinner anode lead 94 as shown in FIG. 5. The diode junction, not shown, is contained in a housing structure 94 which is placed contiguous to the boron nitride surface 90. As shown in FIG. 4, the anode lead 94 is connected to the metallization line 58. However, as is well known in a balanced mixer, the two diodes in the cavities 42 and 44 are energized in mutually opposite polarity relationship. Thus the beam lead package 88 would be reversed in cavity 44.

Referring now to FIG. 6, an alternative to a beam lead diode configuration may be, for example, an arrangement whereby a silicon Schottky diode package 96 is placed in the cavity, bonded to the image plane surface 18 and coupled to the line metallization 58 by means of a gold ribbon connector element 98. As shown in FIG. 7, the diode package 96 includes a diode chip 100 mounted on a metal plate 102 which is also adapted to hold a quartz element 104. The metal plate is adapted to be soldered to the conductive image plane surface 18 shown in FIG. 1. A gold-nickel (NIORO) whisker 106 feeds out of the top of the diode chip 100 and extends along the top of the quartz element 106 over which is placed a metal plate 108. The gold ribbon 98 connects the top metal plate 108 to the conductor line portion 74.

Thus what has been shown and described is an integrated balanced mixer structure which is adapted to be fabricated from a dielectric (BN) wafer which is soldered onto a metal image plane.

Having described what is at present considered to be the preferred embodiments of the subject invention, modifications thereto will readily occur to those skilled in the art. It is not desired, therefore, that the foregoing detailed specification be considered in a limiting sense, since all alterations, modifications coming within the spirit and scope of the invention are herein meant to be included.

We claim as our invention:

1. A millimeter image waveguide balanced mixer integrated circuit adapted to be powered from a source of electrical power and coupled to IF amplifier means, comprising in combination:
   a metal substrate having a conductive surface defining an image plane;
   two adjacent lengths of image guide consisting of dielectric material having a relatively low propagation loss to millimeter wave signals applied thereto and including a layer of metallization on one surface thereof which is bonded to said conductive surface, said length of image waveguides having an intermediate signal coupling region consisting of a slot type of separation of predetermined length and width to provide a signal couplng region;

image waveguide to metal waveguide transition means consisting of a portion of said conductive surface and a metal body having a pair of rectangular or cross-sectional channels formed in one surface thereof which is secured to said conductive surface to form a pair of hollow metal waveguide sections providing first and second signal ports, are respectively adapted to receive an input signal and a local oscillator signal and wherein like end portions of said two lengths of image guide are respectively tapered and located inside of said metal waveguide sections;

a cavity structure consisting of a metallized body of dielectric material and including a layer of metallization on one surface which is bonded to said conductive surface, said body including two separate cavities, each having metallized outer surfaces and an opening adapted to respectively receive like opposite end portions of said two lengths of image guide and respectively including decoupling slots on either side of said image guide for decoupling the image guides from the respective cavities, said end portions additionally having conductor line patterns formed on the upper surface of the respective image guides opposite said one surface for coupling IF signals away from said cavities;

an active millimeter wave mixer device located in each of said cavities and including means for being coupled to said source of electrical power and being coupled to said line pattern of the respective image guide for coupling IF signals thereto; and means coupling IF signals from said respective line patterns to said IF amplifier.

2. The balanced mixer as defined by claim 1 wherein said last recited means comprises a pair of conductor line channels formed in said body of the cavity structure and a conductor line formed in each channels coupled to a respective line pattern on said image waveguides, and said conductor lines being connected to said IF amplifier means.

3. The balanced mixer as defined by claim 2 wherein said conductor line channels connect to the respective cavities in the region of one of the slot separations on either side of said image guide.

4. The balanced mixer as defined by claim 3 wherein each of said conductor line patterns include a millimeter wave matching line portion in the form of a tuning stub extending along the length of the respective image guide on said upper surface.

5. The balanced mixer as defined by claim 1 wherein said two lengths of image guide are comprised of boron nitride.

6. The balanced mixer as defined by claim 1 wherein said metallized body of dielectric material is comprised of boron nitride.

7. The balanced mixer as defined by claim 1 wherein said image guides and said cavity structure are formed from a common wafer of boron nitride bonded to said conductive surface, and wherein said bonded layer of metallization comprises successively applied film layers of chromium, platinum and gold.

8. The balanced mixer as defined by claim 1 wherein the active millimeter wave mixer device located in each said cavity comprises a solid state beam lead diode.

9. The balanced mixer as defined by claim 1 wherein the active millimeter wave mixer device located in each cavity comprises a beam lead diode included in a package secured to the end face of the respective lengths of image guide, said electrical power being applied between the respective conductor line pattern and said substrate, said package having a pair of leads attached to said diode and wherein one lead of said pair is coupled to said substrate and the other lead of said pair is connected to said line pattern.

10. The balanced mixer as defined by claim 1 wherein the active millimeter wave mixer device located in each cavity comprises a solid state Schottky diode.

11. The balanced mixer as defined by claim 1 wherein the active millimeter wave mixer device located in each said cavity includes a pair of electrodes and comprises a silicon Schottky diode device mounted on and having one electrode connected to said conductive surface defining said image plane and including a conductive lead connected between said respective conductive line pattern and said mixer device.

* * * * *